United States Patent [19]
Morton

[11] Patent Number: 4,907,148
[45] Date of Patent: Mar. 6, 1990

[54] CELLULAR ARRAY PROCESSOR WITH INDIVIDUAL CELL-LEVEL DATA-DEPENDENT CELL CONTROL AND MULTIPORT INPUT MEMORY

[75] Inventor: Steven G. Morton, Oxford, Conn.

[73] Assignee: Alcatel U.S.A. Corp., New York, N.Y.

[21] Appl. No.: 163,177

[22] Filed: Feb. 26, 1988

Related U.S. Application Data

[63] Continuation of Ser. No. 797,718, Nov. 13, 1985, abandoned.

[51] Int. Cl.$^4$ .............................................. G06F 15/16
[52] U.S. Cl. ................................. 364/200; 364/244.8; 364/229
[58] Field of Search ... 364/200 MS File, 900 MS File, 364/736

[56] References Cited

U.S. PATENT DOCUMENTS

| | | | |
|---|---|---|---|
| 3,473,160 | 10/1969 | Wahlstrom | 340/750 |
| 4,021,649 | 5/1977 | Fort et al. | 364/736 |
| 4,065,808 | 12/1977 | Schomberg et al. | 364/200 |
| 4,135,242 | 1/1979 | Ward | 364/200 |
| 4,380,046 | 4/1983 | Fung | 364/200 |
| 4,429,300 | 1/1984 | Yamasawa et al. | 377/64 |
| 4,604,683 | 8/1986 | Russ | 364/200 |
| 4,720,780 | 1/1988 | Dolecek | 364/200 |

FOREIGN PATENT DOCUMENTS

| | | |
|---|---|---|
| 0035647 | 9/1981 | European Pat. Off. . |
| 0121763 | 10/1984 | European Pat. Off. . |
| 1377859 | 8/1972 | United Kingdom . |
| 2129589 | 5/1984 | United Kingdom . |

OTHER PUBLICATIONS

"Parallel Processing Gets Down to Business", by Eric J. Lerner, *High Technology*, Jul. 1985, pp. 20-28.
"The Serial Microprocessor Array (SMA): Microprogramming and Application Examples", by Corsini et al., *5th Annual Symposium on Computer Architecture*, Apr. 3-5, 1978, pp. 230-235.
"Design and Simulation of an MC6800-Based Multimicroprocessor System", by James T. Kuehn, et al., *Proceedings of the 1982 International Conference on Parallel Processing*, Aug. 24-27, 1982, pp. 353-362.
"An Airborne Associative Array Processor", by Urban, *Proceedings of the National Electronics Conference*, Chicago, Oct. 9-11, 1972, vol. 27, pp. 317-321.
"Bipolar Building Blocks Deliver Supermini Speed to Microcoded Systems", by Ajmera, et al., *Electronic Design*, Nov. 15, 1984, pp. 230-234, 236, 238 240 and 242.
IBM Technical Disclosure Bulletin, vol. 22, No. 2, Jul. 1979, "Shift Register Shift-In-Bit Control", by G. R. Mitchell, pp. 765-769.
*IEEE Computer Society Workshop on Computer Architecture for Pattern Analysis & Image Database Management*, 11/1981, "Towards cl:p 6, An Extra Dimension", by Fountain, pp. 525-530.
"Design of a Massively Parallel Processor", by Kenneth Batcher, 1980 *IEEE Computer Society*, pp. 80-85.
"A Study of Fault Tolerance Techniques for Associative Processors", *National Computer Conference*, 1974, pp. 643-652, by Parkami, et al.
"An LSI Adaptive Array Processor", IEEE Journal of Solid State Circuits, Apr. 1983, pp. 147-155, by T. Kondo, et al.
"Multiprocessing Technology", by Chuan-Lian Mu, *IEEE Computer*, Jun. 1985.

*Primary Examiner*—Lawrence E. Anderson
*Attorney, Agent, or Firm*—Peter C. Van Der Sluys

[57] ABSTRACT

In an array of processing cells arranged as a single instruction multiple data processor, each processing cell contains logic which enables the cell to determine individually whether it will perform an arithmetic or logic operation or be in an idle condition. This cell-level logic includes a control register whose contents determine the operating or idle condition of the cell, and also includes PUSH/POP/COMPLEMENT stack mechanisms to represent multiple complex levels of conditions, and mechanisms to load the results of a cell-level test or arithmetic instruction into the control register, providing data-dependent control at the cell level.

13 Claims, 8 Drawing Sheets

NESTED IF-THEN STATEMENTS

FOR i = 1 TO 16 BEGIN IN PARALLEL

IF Ai < Bi THEN BEGIN

Ai ← Ai + 5

Bi ← Z + Bi        BLOCK A

IF Ci = Di THEN BEGIN

Ai ← Ai + Ci

Di ← Z * Ai        BLOCK B

ELSE BEGIN

Ai ← Ai + Ci

Di ← -Z * Ai       BLOCK C

ENDIF

ENDIF

ENDIF

FIG. 2

ARRAY PROCESSOR WITH INTERNAL MASKING

TABLE 1   VERTICAL MASKS FOR 4-ROW MACHINE a)  0 - ROW 0
    0 - ROW 1
    0 - ROW 2
    0 - ROW 3 i)  0
    0
    0
    -1 b)  -1
    0
    0
    0 j)  -1
    0
    0
    -1 c)  0
    -1
    0
    0 k)  0
    -1
    0
    -1 d)  -1
    -1
    0
    0 l)  -1
    -1
    0
    -1 e)  0
    0
    -1
    0 m)  0
    0
    -1
    -1 f)  -1
    0
    -1
    0 n)  -1
    0
    -1
    -1 g)  0
    -1
    -1
    0 o)  0
    -1
    -1
    -1 h)  -1
    -1
    -1
    0 p)  -1
    -1
    -1
    -1

NOTE: ALL COLUMNS HAVE THE SAME DATA

FIG. 5

|   | COL, COL, COL, COL<br>3   2   1   0 | HORIZONTAL MASKS FOR<br>4-COLUMN MACHINE |
|---|---|---|
| a) | 0, 0, 0, 0, | |
| b) | 0, 0, 0, -1, | |
| c) | 0, 0, -1, 0, | |
| d) | 0, 0, -1, -1, | |
| e) | 0, -1, 0, 0, | |
| f) | 0, -1, 0, -1, | |
| g) | 0, -1, -1, 0, | |
| h) | 0, -1, -1, -1, | |
| i) | -, 0, 0, 0, | |
| j) | -1, 0, 0, -1, | |
| k) | -1, 0, -1, 0, | |
| l) | -1, 0, -1, -1, | |
| m) | -1, -1, 0, 0, | |
| n) | -1, -1, 0, -1, | |
| o) | -1, -1, -1, 0, | |
| p) | -1, -1, -1, -1, | |

NOTE: ALL ROWS HAVE THE SAME DATA

FIG. 6

MASK MEMORY MAP FOR 4×4 MACHINE

ADDRESS 0-15    VERTICAL MASKS 16-31   HORIZONTAL MASKS

FIG. 7

EXAMPLE OF ARRAY SUBSET

|  | | 0 ↓ COL 3 | 1 ↓ COL 2 | 1 ↓ COL 1 | 1 ↓ COL 0 |
|---|---|---|---|---|---|
| 0 → | ROW 0 | 0,3 OFF | 0,2 OFF | 0,1 OFF | 0,0 OFF |
| 1 → | ROW 1 | 1,3 OFF | 1,2 ON | 1,1 ON | 1,0 ON |
| 1 → | ROW 2 | 2,3 OFF | 2,2 ON | 2,1 ON | 2,0 ON |
| 1 → | ROW 3 | 3,3 OFF | 3,2 ON | 3,1 ON | 3,0 ON |

FIG. 8

NON-ORTHOGONAL PROCESSOR SUBSET

|  | COL 3 | COL 2 | COL 1 | COL 0 |
|---|---|---|---|---|
| ROW 0 | OFF | OFF | OFF | OFF |
| ROW 1 | OFF | OFF | ON | OFF |
| ROW 2 | OFF | ON | OFF | ON |
| ROW 3 | OFF | OFF | ON | OFF |

FIG. 9

CELLULAR ARRAY PROCESSOR WITH INDIVIDUAL CELL-LEVEL DATA-DEPENDENT CELL CONTROL AND MULTIPORT INPUT MEMORY

This is a continuation of co-pending application Ser. No. 797,718 filed on Nov. 13, 1985, now abandoned.

CROSS REFERENCE TO RELATED APPLICATIONS

Reference is hereby made to the following related U.S. Patents: U.S. Pat. Nos. 4,507,748 issued Mar. 26, 1985; 4,536,855 issued Aug. 20, 1985; and U.S. Pat. 4,546,428 issued Oct. 8, 1985. All three of the above-referenced patents are commonly assigned herewith.

Reference is hereby made to the following copending U.S. patent applications: U.S. application Ser. No. 473,365 filed Mar. 8, 1983 now abandoned; U.S. application Ser. No. 473,362 filed Mar. 8, 1983 now U.S. Pat. No. 4,580,215; U.S. application Ser. No. 782,850 filed Oct. 2, 1985 now U.S. Pat. No. 4,722,084. All three of the above U.S. patent applications are commonly assigned herewith.

BACKGROUND OF THE INVENTION

1. Field of the Invention

This invention relates to control of processing in a rectangular array of similar processing elements as included in a cellular array processor and more particularly to such an array of processing elements and the control of processing elements as included in a single instruction multiple data (SIMD) processor.

2. Description of the Prior Art

Cellular array processors are well known and are arrays of relatively simple processors where each cell in the processor is connected only to its nearest neighbor cells. Many companies supply such devices and such devices are commercially available. A conventional processor operates on one data item at a time in a sequential manner, whereas a cellular array processor operates on many data objects at the same time under control of a single instruction stream.

For such processors to be useful, the data objects must be of the same type for any individual instruction so that it is meaningful to apply the same sequential instruction stream to operate simultaneously on these data objects. This class of processor is known as a single instruction multiple data (SIMD) processor. Cellular array processors may consist of a rectangular array of cells arranged in a matrix having M columns and N rows.

These cellular computers obey the same instructions simultaneously, each capable of operating on its own data. The cells as is known can communicate in all four direction with their neighbors and also with external data input and output registers for more distant communication.

The net effect is that of a set of computer which when they are enabled, obey the same arithmetic or logic operations simultaneously on different data items.

SUMMARY OF THE INVENTION

The purpose of this invention is to control the processing in a rectangular array of such processing cells. Such an array of processing elements as in a single instruction multiple data or SIMD structure requires that have a technique to have some of the processors obey a given instruction and for other processors not to obey the instruction. In particular for those processors that do not obey the instruction, it is sufficient that they are idle. In being idle they do not modify their own state. For example, suppose one is operating on a vector of data which may consist of 16 elements being operated on at exactly the same time. If one desired to perform an absolute value operation then for those values that are negative, the processor should take the complement of the data. For those values that are positive, the value should be left alone Hence there is a need to provide a means of having certain of the processors obey an instruction, as for the above example, two's complement, and for the other processors, to be idle.

As will be explained, it is a primary objective of this invention that the means by which the processors may obey or may not obey the instruction is integrated into the array of processing elements, and that complicated sequences of test conditions may be evaluated efficiently. This is in contrast to the prior art whereby such processing control was external to the array, or where only a single control bit per cell was provided. By being integrated into the array and being multiple bits, performance is improved because communication throughout the array is minimized, multiple test conditions may be handled, and the array may work in arbitrarily defined subsections. This aspect of the present invention will be explained in greater detail in the specification as to show some of the constraints imposed by prior art processors and the techniques employed in such prior art processors in determining which of the cells should be operative for a given arithmetic or logical operation.

A processor array of the type including a plurality of processor cells arranged in a matrix having M columns and N rows, with said processing cells each connected to neighboring cells in the vertical and horizontal directions to form said array, with said array being coupled to a controller for providing instructions to said array and associated with a program memory for storage of data and instructions, with said controller further coupled to an address generator for accessing memory connected to the cells in said array, the improvement therewith of apparatus for causing each cell in said array to manifest an operative state or an idle state according to data and instructions received by said cell, comprising arithmetic logic means having a plurality of input ports for receiving data from said controller and an output port, logic means including a control register coupled to said output port and operative to receive a predetermined instruction from said controller indicative of a given bit state manifesting said operative condition, whereby if said given bit state is not detected, said cell is rendered idle, and means included in said logic means operative to detect said given bit state indicative of said operative state for said cell.

BRIEF DESCRIPTION OF THE DRAWINGS

FIG. 2 is a table depicting a sequence of conditions that must be satisfied for a plurality of processors to perform a particular operation.

FIG. 5 depicts a series of vertical masks for a four-row machine according to this invention.

FIG. 6 depicts a series of horizontal masks for a four-column machine according to this invention.

FIG. 7 depicts a mask memory map for a four by four machine as depicted in FIGS. 5 and 6.

FIG. 8 depicts an example of an array subset.

FIG. 9 depicts a nonorthogonal processor subset.

DETAILED DESCRIPTION OF THE INVENTION

Before proceeding with a detailed explanation of the nature of the invention, it is believed that it would be advantageous to describe prior art parallel processors in order to indicate the general nature of the problem.

There have been many excellent articles in the literature on the various forms of parallel processors. See for example the *IEEE Computer* issue of June 1985 which gives an excellent analysis of parallel processors. In addition, the July 1985 issue of *High Technology* reviewed parallel processors from a business perspective.

Figure 1:
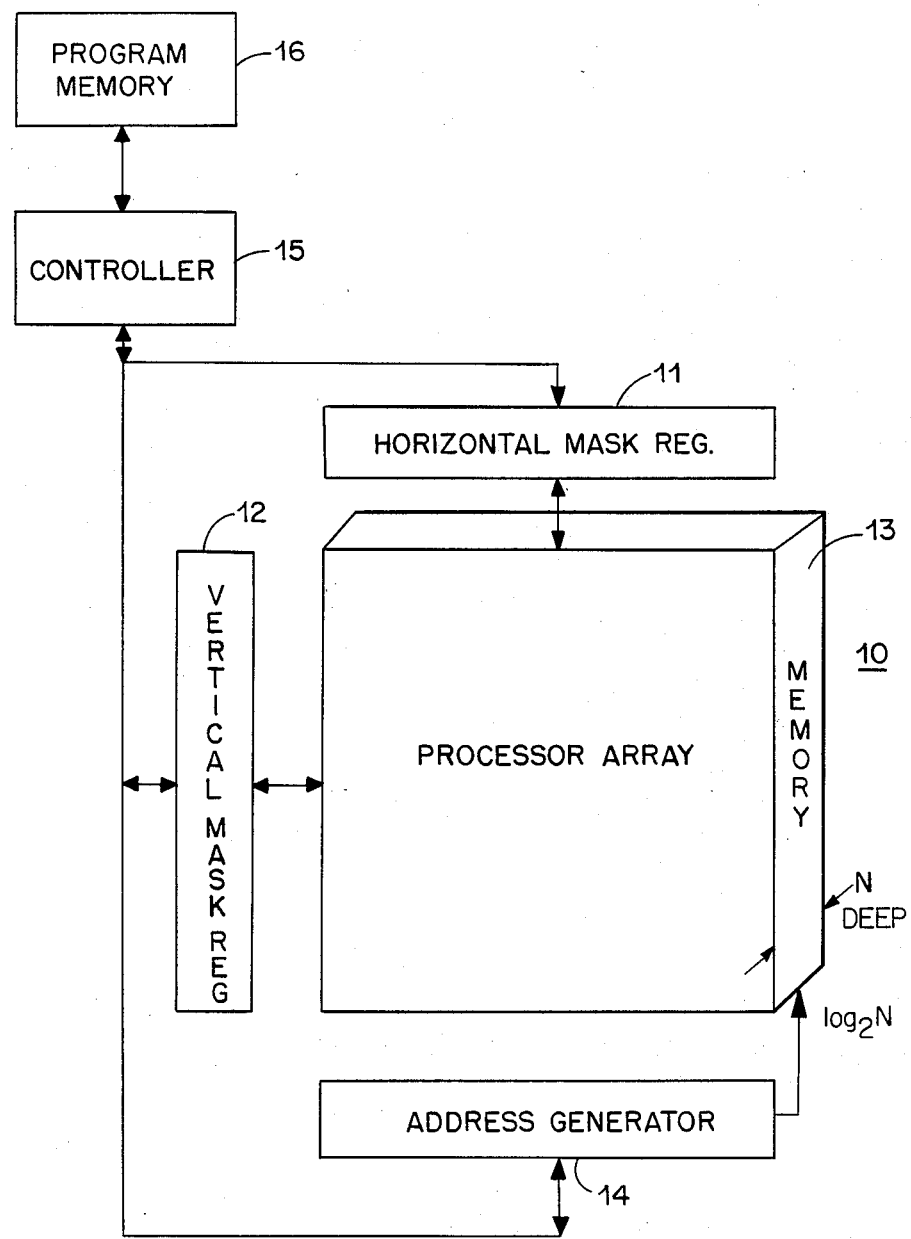
FIG. 1 is a simple block diagram of a conventional parallel processor typical of those found in the prior art.

Referring to FIG. 1, there is shown a block diagram of a conventional parallel processor 10. The parallel processor includes a controller 15 that obtains stored instructions from the program memory 16. The controller 15 communicates with the processor array 13 by means of the vertical mask register 12, the horizontal mask register 11 and an address generator 14. Both the horizontal mask and the vertical mask as shown in FIG. 1 consist of normal registers which interface with the processor and the controller through bidirectional buses.

As seen from FIG. 1, the controller 15 may communicate with the processor array 10 by means of the vertical mask 12, the horizontal mask 11 and the address generator 14. The array 13 is composed of a rectangular collection of like processing elements. Assume for simplicity that each processing element is a 1-bit cell, but this is not a fundamental requirement.

Each cell of the processing array has associated with it a memory which is shown in the drawing in a perspective sense as being located behind the processor array. In order to turn on a section of the processor array and to thereby activate a given number of cells, the vertical mask bits which correspond to the columns that are to be turned on and the horizontal mask bits corresponding to the rows to be selected must be set true. So a given cell in the processor array is active at the intersection of the vertical mask and the horizontal mask being true. This intersection condition or the outcome of a test internal to the cells may be transferred to a single bit condition register internal to the cell.

This operation forces cells to be idle and results in a completely inefficient use of the array whereby a great deal of time is taken in the selection process. Another difficulty arises when one attempts to implement a complex sequence of operations as is typically found in a high level language such as Pascal.

Assume one wants to implement a series of nested IF-THEN statements.

FIG. 2 shows that there is a sequence of conditions that must be satisfied for the i'th processor to perform an operation. In particular the collection of operations may have been subservient to another set of operations which are themselves subsetting the processor. It may furthermore be true that the number of levels of subsetting is known only at execution time and not at compile time. Therefore, it is extremely difficult to partition the array of FIG. 1 in a conventional sense.

Referring to FIG. 2, assume that when the above procedure is entered, the entire array is operational. Now in a vector processor, assume that all values of i are executed simultaneously because one has 16 processors, each of them handling one of the values of i. In block A the i'th processor will be operational only if the condition ($A_i$ less than $B_i$) is true. Then, in Block B for those processors that are active, the active processors will remain active only if $C_i$ equals $D_i$.

Therefore, block B will be executed only by those processors satisfying the first two conditions. Coming out of Block B, those processors that did not execute the code in Block B but that still satisfy the Block A condition will now execute. That is to say, the test $C_i$ equals $D_i$ which was true for the i'th processor in Block B is complemented. That is the ELSE function where the ELSE means complement and will be executed in Block C. So Block A is executed by all processors satisfying $A_i$ is less than $B_i$. Block B will be executed by those processors that satisfy the first condition and that also satisfy the condition $C_i$ equals $D_i$. So essentially, one obtains a set of subsetting conditions where first some of the processors survive then some more of them are inactivated, although among the ones that were inactivated in the first phase such as in Block B some of them will begin to operate in Block C. Note that the ELSE condition does not require the retesting of $C_i$ equals $D_i$, only the complement of the result of the test.

In any event, this subsetting may in principle go on indefinitely. There may be more and more tests, each of them taking a further subset. Furthermore, it may not be known at compile time how many levels there are for the simple reason that one procedure which has a collection of nested IF-THEN ELSE statements may be compiled separately from another procedure which is called or accessed by the first procedure.

It is therefore the purpose of the present invention to allow for a multiplicity of processors in a given row to be able to operate independently and, furthermore, that that multiplicity of processors may respond to a very complex set of conditions where the number of such tests is not known at compile time but is known only at run time.

Figure 3:
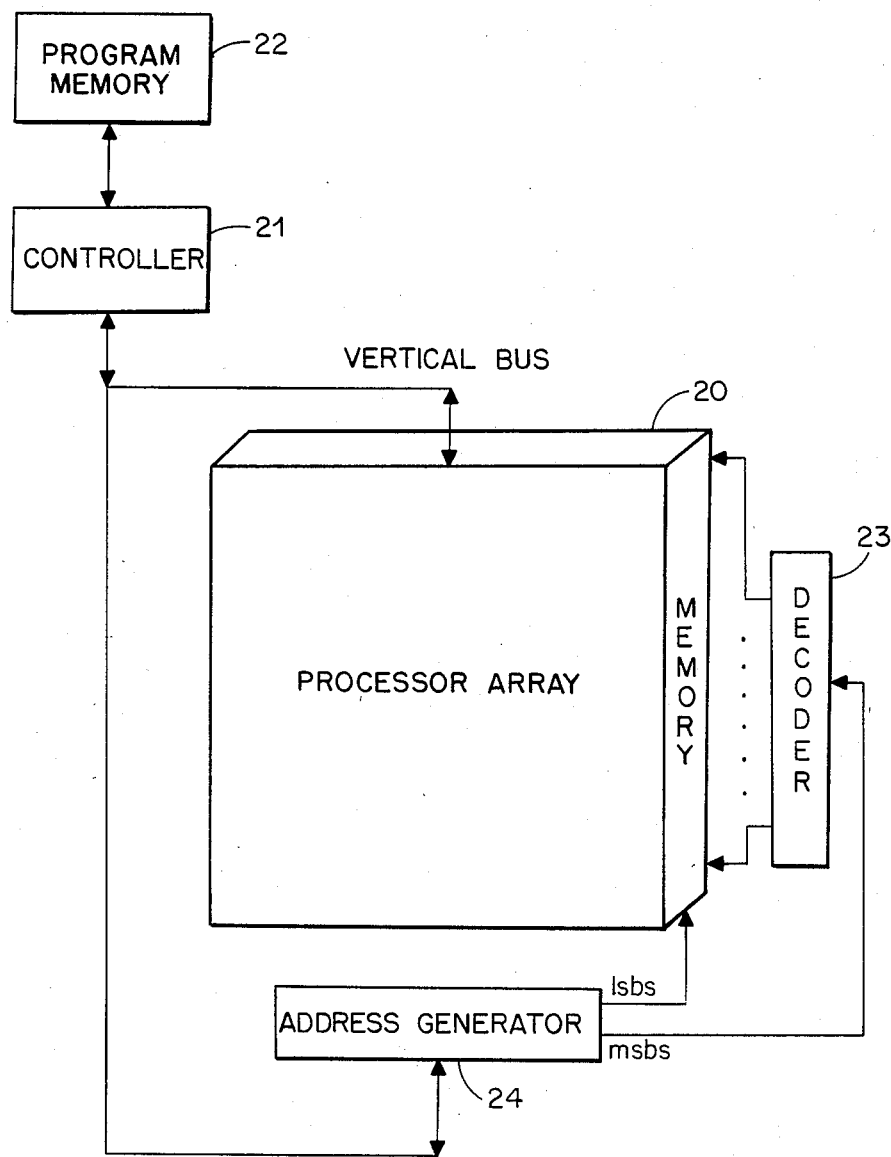
FIG. 3 is a simple block diagram of an array processor according to this invention.

Referring to FIG. 3, there is shown an array processor with internal masking according to this invention. It is immediately noted that the horizontal mask and vertical mask registers which are part and parcel of the conventional parallel processors are not included in FIG. 3.

In FIG. 3, the array 20 consists of a plurality of processor cells arranged in an M×N matrix as in a rectangular matrix. Such an N×M matrix is typical but not a requirement. The processor array is accessed by a controller 21 having associated storage afforded by the program memory 22. The controller 21 interfaces with an address generator 24. The address generator 24 has two outputs, one designated as the least significant bits and the other as the most significant bits. The least significant bits output is directed to the array 20 while the most significant bits are directed to a decoder 23.

The decoder 23, as will be explained, has multiple outputs which operate to select various rows in the processor array. Each cell in the processor array has the ability to turn itself on or off depending upon the data the cell evaluates and according to the instructions that are issued by the controller 21. In addition, the number of conditions that must be satisfied by a processor to execute an operation is in principle unlimited, unlike the earlier example where there were just two conditions, namely, the horizontal and the vertical conditions.

Furthermore, as will be explained, a number of conditions to be satisfied does not need to be known at compile time. These only need to be known at run time. The program memory 22, the controller 21 and the address generator 24 are of conventional design and are well known in the art.

Basically, the program memory 22 is a collection of random access memories or RAM devices. The controller 21 provides instruction fetch and execution logic. It typically contains a microprogram sequencer which responds to an instruction set that is implemented for a particular processor array. Examples of such controller as 21 are well known in the art.

The address generator 24 is typically a counter or register which is loaded by the controller in response to the instructions so that a particular memory location may be accessed by the entire processor array.

Figure 4:
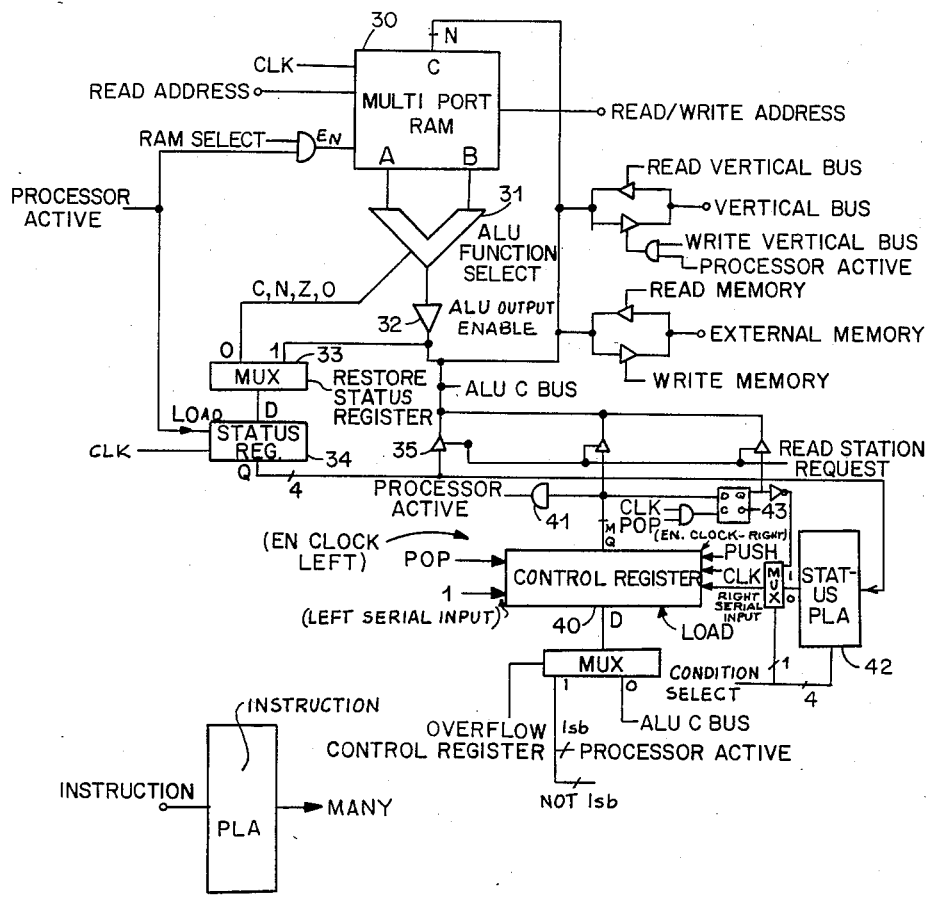
FIG. 4 is a detailed block diagram showing an array processor cell according to this invention.

Referring to FIG. 4, there is shown a typical processor cell. The processor array of FIG. 3 is composed of a collection of these processor cells. For the sake of simplicity assume that there is a matrix of processors in FIG. 3 wherein there are two 16-bit processor; per row and 32 rows. This would give one a processors array comprising 32 times 32 bits of processor by way of example. In regard to FIG. 4, the computation portion of the processor cell consists of a multiport RAM 30 from which two locations A and B may be read simultaneously as chosen by the read address and the read/-write address, and one location may be written where the location of the write is the read/write address. The outputs of the multiport RAM 30 designated as A and B go to an arithmetic logic unit or ALU 31. The ALU 31 and multiport RAM 30 are of conventional design and such components exist in the prior art. For a typical example, see the 2903 which is a 4-bit slice chip manufactured by Advanced Micro Devices.

Control to the cell comes in the form of the instruction, the read address and the read/write address; all of which emanate from the controller 21 of FIG. 3. As one can see from FIG. 4, the output of the ALU is directed to a buffer 32. One output of the buffer is connected to a multiplexer 33 wherein another output of the ALU is connected to another input of the multiplexer 32. The output of the multiplexer is directed to a status register 34 which receives system clock. The output of the status register 34 is directed to a buffer 35 whose output is coupled to the C input of the multiport RAM 30.

The status register also interfaces with a status PLA 42. The PLA which is a programmable logic array will be explained subsequently. The state of the multiport RAM and the status register may only be changed if the RAM write enable is true. The status register 34 contains the carry (C), negative (N), zero (Z) and overflow (0) outputs from the ALU 31. Again, according to the conventional definition of those four signals.

It is the purpose of the invention to control the RAM write enable signal within each processor cell. First assume that the RAM write enable is true. In this case for an instruction such as ADD, two locations are addressed in the multiport RAM. The ALU 31 adds the operands, returns the result to the multiport RAM 30 and the status register 34 is updated according to the carry, negative, overflow and zero conditions of the result of the ADD.

Now assume some of the processor cells in a matrix or in an array are to perform the ADD and some of them are not. The RAM write enable signal is of particular interest. First when the processor is initialized, a sufficient number of instructions must be issued to the instruction PLA, to set the control register 40 to all ones. In particular an instruction must be executed to POP the state of the control register 40. Each issuance of the POP instruction will shift the control register 40 right, entering a one into the (msb) most significant bit. As one can see from FIG. 4, there is a POP input which is directed to the control register 40. Assume that m, the number of outputs at the control register is 8, although this particular number is immaterial. When the control register 40 is full of ones, namely, eight ones, the AND gate 41 which is monitoring the output of the control register 40 will see all ones and the RAM write enable will be true.

Therefore, all subsequent instructions will result in the loading of the multiport RAM 30 and the loading of the status register 34 until the control register 40 is changed. Suppose that according to the early example, one desires to perform an absolute value operation. In this case only the data that is negative should be operated on in order to complement it and set it positive. One would execute an instruction sequence that does the following:

A location would be read from the multiport RAM 30 and be returned unmodified, and the status register 34 would, therefore, be loaded with the sign of the data. On the following instruction, the ALU 31 would be commanded to perform some operation, an operation that does not depend on the state of the test, and the status PLA 42 would be commanded to select the condition wherein the state of the status register 34 may indicate whether the previous data was positive or negative. In this simple case only the sign bit need be interrogated.

Therefore, the sign bit would be presented at the input to the control register 40, and the PUSH signal would be set at true. In this case the control register 40 would shift left and the sign bit would be entered into the (lsb) least significant bit of the register. If the data were negative, the sign bit would be true and the control register 40 would still contain ones. If the data were positive then the sign bit would be zero, and the control register 40 would now contain a zero. So in the case where the data were negative, the control register 40 still contains ones and the RAM write enable remains true as detected by gate 41.

The cell may continue processing, for example data may be complemented, and the result will be written into the multiport RAM 30. If the data were positive, the control register 40 will now contain a zero. The RAM write enable would be false, and no data would be loaded into the multiport RAM 30 or the status register 34. Thus the sequence of operations may be performed as is required to carry out the case where the data was negative. For those processors where the data is positive, no change in the state of the multiport RAM 30 or the status register 34 will occur.

If additional test is to be performed then the status PLA 42 is commanded to evaluate the state of the status register 34 bits, and the result is again loaded into the right serial input to the control register 40 according to the PUSH instruction clocking the data into the control register. For example, one may be interested to know whether the result was greater than zero as opposed to either greater than or equal to zero or less than zero.

In such a case a second bit would be loaded into the control register 40 and only if all the bits of the control register remain true would the cell remain enabled. When one is no longer interested in the result of an operation, the bit may be removed from the control register 40 by executing a POP instruction. The POP instruction shifts the control register to the right by one bit and a one is entered into the left serial input. At the same time, the bit that is shifted out of the control register 40 is entered into a single bit flip flop 43.

One is then in a position to enter the complement of the bit back into the right serial input in the control register. This implements the ELSE feature in the IF-THEN ELSE structure as outlined earlier. Therefore, one can readily implement the structure of the form IF a is true then perform a sequence of operations, ELSE perform a different sequence of operations. The ELSE serves to complement the result of that particular test.

Another feature of the write enable mechanism is that it may be used to select one of the many processors so that it may communicate on the vertical bus to the controller. As seen from FIG. 3, the vertical bus is coupled to the controller via a bidirectional transmission path.

Notice that the vertical bus may be used by the controller 21 to transmit data simultaneously to a collection of processor cells. It will transmit data to those processor cells whose write enable line is true. Inversely, for the controller 21 to read data from a processor cell, since there is a multiplicity of cells that may transmit on a single bus, then only one of those processor cells may be enabled. One may, therefore, execute a sequence of operations resulting in the loading of the control register 40 and under the assumption that the set of operations identifies a single processor cell, then a read is done from a processor cell, and the read will occur only from the processor cell whose write enable line is true. Thus as one can see, the driver 32 from the output of the ALU 31 to the vertical bus is enabled only if two conditions are satisfied:

First, that the write vertical bus line that comes from the instruction PTA is true, and that the RAM write enable is also true. Therefore, one would execute an instruction that sets the write vertical bus true and that reads the desired data from the multiport RAM 30. The implementation of the status register 34 employs a conventional 4-bit parallel load shift register where the loading occurs if the load line is true and there is a clock input. In that case the data at its input is transferred to its output.

The implementation of the control register 40 is a conventional clocked shift left, shift right, parallel in-/parallel out, shift register where it shifts to the right if the signal named POP is true, and it shifts to the left if the signal named PUSH is true. It has an input which is the left serial input for entering data in the left and an input which is the right serial input for entering data from the right.

It has a parallel input controlled by LOAD for restoring its state after an interrupt or overflow or underflow. If neither the PUSH nor POP nor LOAD input is true, the state of the register 40 is unchange. The instruction PLA which is shown in generalized block diagram form is of conventional design and would be tailored to a particular processor. Typical instructions such as ADD, SUBTRACT, AND, OR would be carried out by the ALU 31 as well as data movement operators such as reading or writing to memory or reading and writing the vertical bus as well as operators what control the control register 40—namely, the PUSH and POP functions as well as to select the condition going into the status PLA 42.

In a similar manner the status PLA 42 is of conventional design and is used to detect the 16 sets of status register conditions, such as positive or negative, greater than zero, less than or equal to zero, among others. The detection of these conditions would result in the 1-bit output being set true which is used as the right serial input to the control register 40. Controller 21 also keeps a count of the number of bits that have been loaded into the control register 40 of a cell to detect a control register overflow or underflow condition.

If, for example, the control register 40 has eight bits and the program attempts to push a ninth bit into it then a counter in the controller 21 would indicate an error wherein too many bits have attempted to be stored, and the program can deal with that such as by aborting and returning control to the user or by saving the state of the control register 40 in each cell and by writing the logical AND of all bits of the control register 40 back into a single bit of the control register while initializing the other bits to ones.

When a sufficient number of bits have been popped then this initial state of the control register can be returned. It is important to note that there is no specific assignment of test conditions to any particular bit in the control register 40. This is true since all bits in the control register are treated alike. Hence there is a stack organization where each test places another bit in the control register. Therefore, it is not necessary to know at what level one is executing a test. It may be simply determined at run time rather than at compile time.

It is also important to note that the control registers as 40 in all cells either PUSH or POP simultaneously and regardless of the state of the RAM write enable which is, in fact, determined by the control register. Even though this results in the pushing of invalid data into the control register on those cells that are inactive, what is important is that the first zero that is written into a control register is sufficient to deactivate the cell in which case subsequent bits are, in fact, don't cares in those inactive cells.

By having all control registers PUSH and POP simultaneously, there is no difficulty with different numbers of bits being written into the control register in different cells and with having to have special cases that determine whether or not control registers get pushed or popped based on their current state. Simply, all registers push and pop simultaneously regardless of their state, therefore, greatly simplifying the design.

Also notice that the control register 40 may be saved in regard to all data and subsequently restored so that the machine may be built to swap tasks wherein the state of the control register 40 is defined as part of the processor state and may be saved when a task is stopped and restored when a task is resumed.

In order for the controller as controller 21 of FIG. 3 to communicate with one or more rows of its choice, it is necessary that the RAM write enable in the cells that it chooses to communicate with be true and the RAM write enable be false in the other cells. This RAM write enable is essentially the processor active signal which emanates from gate 41. Hence the problem is how does a set of conditions arise wherein this is true. Basically, one has to understand how the machine or the processor array as 20 of FIG. 3 is initialized.

Again, assume that the processor array contains 16 rows of processors. There are, therefore, 16 squared combinations of processors. Assume that in the memory external to the processor array, one has 256 sets of masks. These masks are contained in array memory 25. The controller 21 via the address generator 24 selects one of those 256 sets of masks and causes it to be loaded into a location in the multiport RAM 30. Once a mask is loaded into the multiport RAM, a test may be made, and based upon the test, a cell will set its RAM write enable true or false.

The patterns or mask patterns can be placed in memory in various ways. One way is that there exists a read-only memory which would be part of the memory in each cell so that the pattern becomes static. Another solution which avoids the read-only memory associated with each cell is to utilize a global memory map in regard to the controller 21. In this case the controller 21 sends an address to the address generator 24. The address selects a single row of memory for activity. The controller then transmits data to all rows and those rows write directly to memory; but since only one of the rows has been selected for activity by the address decoder 23, the pattern will stored in only that row.

So, by sequencing through each of the rows in each of those 256 addresses, that pattern may be fed into memory at system initialization. During normal operation, the controller 21 would send an address to the generator which results in all rows of the memory being active rather than just selecting one of them. The address map as seen by the controller is, therefore, a collection of addresses wherein all memories are active from the point of view of the processor array, and another set of addresses wherein only a particular row is active, although this is unknown to the processor array and is only known to the controller 21.

Referring to FIG. 5, there is shown masks for a four-processor machine. The four-processor machine has been chosen as an example to minimize the size of the resultant table shown in FIG. 5. Each processor state is shown by subfigures A through P. In FIG. 5A for example, no processors are active. In FIG. 5H the first three processors in row 0, 1 and 2 are active but 3 is not. In FIG. 5P all four processors are active. It is immediately noted that active has been indicated by a −1 in which case all bits of the word would be one, and inactive is shown by a zero so that when a test is done on a word, if the test is a sign check then the sign of 1 is a 1 in which case a true condition would be entered to the control register and the processor would be active.

In FIG. 5 the data is the same regardless of how many processors there are in a row and serves to distinguish the processors vertically throughout the array.

FIG. 6 also designated as Table 2 shows the horizontal mask for a four-column machine and serves to distinguish between the various processors in a single row.

FIG. 7 shows an example of a memory map for the storing of masks where for a four-row by a four-column machine having a total of 16 processors, one could reserve the first 16 addresses for the vertical mask, and the next 16 addresses for the horizontal masks.

FIG. 8 shows an example of forming an array subset. Referring to FIG. 8 assume that one desires to turn on those processors that are at the intersections of rows 1, 2, and 3 and columns 0, 1 and 2. One first addresses the horizontal mask which would select rows 1, 2 and 3.

Referring back to FIG. 5, one can see that case 0 would turn on rows 1, 2 and 3. Therefore, an address of 14 is sent to the address generator which selects one of the sets of vertical masks, in particular set 0. That mask is loaded into the processors which test the data and the sign of the data is pushed into the control register. At this point, only the processors in rows 1, 2, and 3 are active. However, all columns would be active.

Referring back to FIG. 6, the horizontal mask which selects columns 0, 1 and 2 would be fetched. This is case H. The address corresponding to horizontal mask H, in particular address 23, is sent to the address generator and the mask is fetched. The active cells do a sign test and the result is pushed into the control register. At this point, two bits have been loaded into the control register, and those two bits are both true only for the intersections of the lower three and right three rows. At this point, operations on those nine processors proceeds and the effect is the same as having a set of horizontal mask registers and vertical mask registers and the intersection of those would be selected. At this point, those processors perform some operation and some completely arbitrary collection of those nine processors may be left active, a state that could not be obtained if one simply took the X and Y intersection of external registers.

FIG. 9 shows a case where simple intersections could not select desired processors. This complex configuration is supported by the invention herein.

According to the above, as one will understand, the invention pertains to any single instruction multiple data (SIMD) processor whether for general purposes or for application-specific use. The motivation behind having cellular activity selection is that one needs a way of controlling the execution of those processors in the presence of the single instruction stream. In a conventional single instruction, single data processor, each piece of data would be tested and could result in a different program flow, but in a single instruction multiple data processor, there is a single program flow.

Therefore, in order to control the response of a multiplicity of processors to their various data, it is necessary to turn off some of those processors so that they may ignore a particular instruction therein having the same effect as executing different program flows for each of the pieces of data. The only other difference is that if one has data that satisfies both condition X and condition not X then in the single instruction multiple data case, both code segments (that is the code for condition X and the code for condition not X) would have to be executed where in those various code segments only the processors whose data satisfied that condition would be executed, whereas in a conventional processor for a given piece of data, one code segment which the data satisfies would be executed whereas the other code segment would be skipped. However, the effect is the same.

Hence one can see that the invention pertains to processors of any number of bits since the entire processor would operate on its data or not operate on its data. So, any single instruction multiple data processor wherein each of those processors has an arbitrary number of bits may be controlled by the aspects of this invention. The general applications that can make use of single instruction multiple data processors are in image processing, digital signal processing, matrix algebra, and rule based expert systems.

It will, therefore, be obvious to those skilled in the art that there is provided apparatus capable of controlling the processing in a rectangular array of like processing elements. Such an array of processing elements is located in a single instruction multiple data structure, and one provides apparatus to have some of the processors obey a given instruction and for other processors not to obey the instruction. In particular for those processors that do not obey the instructions, it is sufficient if they are idle.

In being idle they do not modify their own state. Those processors which are to be selected turn themselves on based on the data received and hence can process incoming data. The system, therefore, avoids the use of vertical and horizontal masks or single-bit activity masks which are employed in conventional processors of rectangular configurations.

What is claimed is:

1. In a processor array of the type including a plurality of individual processing cells arranged in a N×M matrix, having M columns and N rows, with said processing cells each connected to neighboring cells in the vertical and horizontal directions to form said array, with said array being coupled to a controller for providing instructions to said array with said controller coupled to a program memory for storage of data and instructions, with said controller being further coupled to inputs of an address generator having outputs coupled to said array for accessing groups of cells in said array, the combination therewith of a processing cell structure for inclusion in said array said processing cell comprising:
   memory means having multiple input ports each for receiving separate input data from said controller and a plurality of output ports,
   an arithmetic logic unit (ALU) having a plurality of input ports each separate one coupled to an output port of said memory means, with said arithmetic logic unit having an output port,
   first register means coupled to said output port of said ALU for determining the status of said cell and for providing status data,
   second register means coupled to said first register means and said controller and operative to receive instructions from said controller and status data from said first register means to store therein a code indicative of an operating condition for said cell said operating condition being selected from an active condition and an idle condition for said cell, whereby said cell has the ability to operate or remain idle depending upon the status data from the first register means and instructions received from said controller.

2. The processor array according to claim 1, wherein said processor array is arranged as a single instruction multiple data array.

3. The processor array according to claim 1, wherein said memory means is a RAM having a read address input, a read/write address input, with at least two outputs.

4. The processor array according to claim 1, wherein said first register means includes a status register for storing therein the result of an arithmetic operation implemented by said ALU comprising carry, negative, zero and overflow.

5. In a processor array of the type including a plurality of individual processing cells arranged in a N×M matrix, having M columns and N rows, with said processing cells each connected to neighboring cells in the vertical and horizontal directions to form said array, with said array being coupled to a controller for providing instructions to said array with said controller coupled to a program memory for storage of data and instructions, with said controller being further coupled to inputs of an address generator having outputs coupled to said array for accessing groups of cells in said array, the combination therewith of a processing cell structure for inclusion in said array said processing cell comprising:
   memory means having multiple input ports each for receiving separate input data from said controller and a plurality of output ports,
   an arithmetic logic unit (ALU) having a plurality of input ports each separate one coupled to an output port of said memory means, with said arithmetic logic unit having an output port,
   register means coupled to said output port of said ALU for determining the status of said cell,
   a control register coupled to said register means and said controller and operative to receive data and instruction from said controller and said register means to store therein as first code indicative of an operating condition for said cell and a second code indicative of an idle condition for said cell, said control register having a first input designated as a POP input for shifting to the right a received binary number and a second input designated as a PUSH input for shifting to the left a test condition result, whereby said cell has the ability to operate or remain idle depending on said data and instructions received.

6. The processor array according to claim 5, wherein said control register is a clocked shift left, shift right, parallel in/parallel out shift register operative to shift to the right for a high on said POP input and operative to shift to the left for a high on said PUSH input.

7. The processor array according to claim 6, wherein said control register further has a third input designated as a left serial input for receiving data from said controller for shifting to the right and a fourth input designated as a right serial input for receiving data from said controller for shifting to the left.

8. The processor array according to claim 7, wherein said control register further includes a parallel input designated as LOAD for restoring the state of said register as controlled by said controller.

9. The processor array according to claim 7, wherein said controller further includes means for counting the number of bits PUSHED into said control register to determine whether said number of bits are capable of being accommodated by said register.

10. In a processor array of the type including a plurality of individual processing cells arranged in a N×M matrix, having M columns and N rows, with said processing cells each connected to neighboring cells in the vertical and horizontal directions to form said array, with said array being coupled to a controller for providing instructions to said array with said controller coupled to a program memory for storage of data and instructions, with said controller being further coupled to inputs of an address generator having outputs coupled to said array for accessing groups of cells in said array, the combination therewith of a processing cell structure for inclusion in said array said processing cell comprising:
   memory means having multiple input ports each for receiving separate input data from said controller and a plurality of output ports;
   an arithmetic logic unit (ALU) having a plurality of input ports each separate one coupled to an output port of said memory means, with said arithmetic logic unit having an output port;

first register means coupled to said output port of said ALU for determining the status of said cell and for providing status data;

second register means coupled to said first register means and said controller and operative to receive instructions from said controller and status data from said first register means to store therein a code indicative of an operating condition for said cell, said operating condition being selected from an active condition and an idle condition for said cell, whereby said cell has the ability to operate or remain idle depending upon the status data from the first register means and instructions received from said controller; and an array memory having stored therein a number of masks, said number corresponding to the sum of the square of the number of processing cells in a row and the square of the number of processing cells in a column of said array, said controller being operative to select any desired one of said masks by transmitting an address to said saddress generator, whereby any desired cells may be accessed through the selection of the proper mask.

11. The processor array according to claim 10, wherein said masks include a first plurality of masks indicative of vertical columns M in said array and a second plurality of masks indicative of horizontal rows N in said array.

12. The processor array according to claim 9, wherein said program control memory comprises a plurality of random access memories (RAMS), with said controller being a programmed sequencer.

13. In a processing array of the type including a plurality of individual processing cells arranged in a N×M matrix, having M columns and N rows, with said processing cells each connected to neighboring cells in the vertical and horizontal directions to form said array, with said array being coupled to controller for providing instructions to said array with said controller coupled to a program memory for storage of data and instructions, with said controller being further coupled to inputs of an address generator having outputs coupled to said array for accessing groups of cells in said array, the combination therewith of a processing cell structure for inclusion in said array said processing cell comprising:

memory means having multiple input ports each for receiving separate input data from said controller and a plurality of output ports;

an arithmetic logic unit (ALU) having a plurality of input ports each separate one coupled to an output port of said memory means, with said arithmetic logic unit having an output port;

first register means coupled to said output port of said ALU for determining the status of said cell and for providing status data, said first register means including a status register for storing therein the result of an arithmetic operation implemented by said ALU comprising carry, negative zero and overflow;

second register means coupled to said first register means and said controller and operative to receive instructions from said controller and status data from said first register means to store therein a code indicative of an operating condition for said cell, said operating condition being selected from an active condition and an idle condition for said cell, whereby said cell has the ability to operate or remain idle depending upon the status data from the first register means and instructions received from said controller; and a programmable logic array for decoding the status of the status data from said status register, the selected state being chosen by the controller with an output coupled to said second register.

* * * * *